United States Patent
Seddon et al.

(10) Patent No.: US 10,115,716 B2
(45) Date of Patent: Oct. 30, 2018

(54) DIE BONDING TO A BOARD

(71) Applicant: SEMICONDUCTOR COMPONENTS INDUSTRIES, LLC, Phoenix, AZ (US)

(72) Inventors: Michael J. Seddon, Gilbert, AZ (US); Francis J. Carney, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 120 days.

(21) Appl. No.: 14/812,846

(22) Filed: Jul. 29, 2015

(65) Prior Publication Data

US 2017/0018542 A1    Jan. 19, 2017

Related U.S. Application Data

(60) Provisional application No. 62/194,204, filed on Jul. 18, 2015.

(51) Int. Cl.
*H01L 25/00* (2006.01)
*H01L 21/48* (2006.01)
(Continued)

(52) U.S. Cl.
CPC .......... *H01L 25/50* (2013.01); *H01L 21/4825* (2013.01); *H01L 21/4853* (2013.01);
(Continued)

(58) Field of Classification Search
CPC ............................ H01L 24/97; H01L 25/0655
See application file for complete search history.

(56) References Cited

U.S. PATENT DOCUMENTS

| 5,186,383 A | 2/1993 | Melton |
|---|---|---|
| 2007/0114662 A1 | 5/2007 | Helneder et al. |

(Continued)

FOREIGN PATENT DOCUMENTS

| DE | 19521158 A1 | 2/1997 |
|---|---|---|
| DE | 102006013583 A1 | 10/2007 |
| WO | WO2014023320 A1 | 2/2014 |

OTHER PUBLICATIONS

Takahashi, T. et al., "Development of Ag35n Intermetallic Compound Joint for Power Semiconductor Devices," ElectroMechnical and Solid-State Letters, vol. 12, No. 7, Apr. 29, 2009, pp. H263-H265.
(Continued)

*Primary Examiner* — David Spalla
(74) *Attorney, Agent, or Firm* — Polansky & Associates, P.L.L.C.; Paul J. Polansky

(57) ABSTRACT

A method of bonding a plurality of die having first and second metal layers on a die surface to a board, comprising placing a first die onto a board comprising one of a ceramic or substrate board or metal lead frame having a solderable surface and placing the first die and the board into a reflow oven. The method includes reflowing at a first reflow temperature for a first period until the first metal board layer and at least one of the first and second metal die layers of the first die form an alloy to adhere the first die to the board. The alloy has a melting temperature higher than the first reflow temperature. Accordingly, additional die may be added at a later time and reflowed to attach to the board without causing the bonding of the first die to the board to fail.

9 Claims, 6 Drawing Sheets

(51) Int. Cl.
  *H01L 23/00* (2006.01)
  *H01L 23/495* (2006.01)
  *H01L 23/498* (2006.01)
  *H01L 25/065* (2006.01)
  *H01L 23/482* (2006.01)

(52) U.S. Cl.
  CPC ........ *H01L 23/4827* (2013.01); *H01L 23/495* (2013.01); *H01L 23/498* (2013.01); *H01L 24/27* (2013.01); *H01L 24/29* (2013.01); *H01L 24/32* (2013.01); *H01L 24/83* (2013.01); *H01L 24/97* (2013.01); *H01L 25/065* (2013.01); *H01L 25/0655* (2013.01); *H01L 2224/27849* (2013.01); *H01L 2224/291* (2013.01); *H01L 2224/293* (2013.01); *H01L 2224/29082* (2013.01); *H01L 2224/29083* (2013.01); *H01L 2224/29111* (2013.01); *H01L 2224/29139* (2013.01); *H01L 2224/29147* (2013.01); *H01L 2224/29155* (2013.01); *H01L 2224/29294* (2013.01); *H01L 2224/32225* (2013.01); *H01L 2224/32245* (2013.01); *H01L 2224/32503* (2013.01); *H01L 2224/83048* (2013.01); *H01L 2224/8381* (2013.01); *H01L 2224/8383* (2013.01); *H01L 2224/83211* (2013.01); *H01L 2224/83411* (2013.01); *H01L 2224/83439* (2013.01); *H01L 2224/83447* (2013.01); *H01L 2224/83455* (2013.01); *H01L 2224/83815* (2013.01); *H01L 2224/83825* (2013.01); *H01L 2224/97* (2013.01)

(56) References Cited

U.S. PATENT DOCUMENTS

| | | |
|---|---|---|
| 2007/0141750 A1 | 6/2007 | Iwasaki et al. |
| 2007/0166877 A1 | 7/2007 | Otremba |
| 2007/0205253 A1 | 9/2007 | Hubner |
| 2009/0160039 A1 | 6/2009 | Wong |
| 2011/0193219 A1* | 8/2011 | Lai ................... H01L 24/13 257/737 |
| 2011/0220704 A1* | 9/2011 | Liu ................ B23K 35/0238 228/252 |
| 2012/0306105 A1 | 12/2012 | Robert |
| 2013/0017681 A1* | 1/2013 | Willeke ............ B23K 1/0016 438/614 |
| 2013/0119119 A1 | 5/2013 | Horng |
| 2013/0270700 A1 | 10/2013 | Yu |
| 2015/0001704 A1 | 1/2015 | Lu |
| 2015/0061101 A1 | 3/2015 | Le |
| 2015/0061118 A1 | 3/2015 | Chen et al. |
| 2015/0061158 A1 | 3/2015 | Pharand |
| 2015/0123253 A1 | 5/2015 | Hwang |
| 2015/0163903 A1 | 6/2015 | Wada |
| 2015/0179615 A1 | 6/2015 | Watanabe |
| 2015/0340328 A1* | 11/2015 | Gandhi ................ H01L 24/03 257/762 |
| 2016/0035688 A1 | 2/2016 | Fukuhara |

OTHER PUBLICATIONS

Schmetterer, C. et al., "Phase Equilibria in the Ag—Ni—Sn System: Isothermal Sections," Journal of Electronic Material, vol. 36, not. 11, Sep. 25, 2007, [ages 1415-1428.
ONS01778 Action on the Merits by U.S.P.T.O regarding U.S. Appl. 14/812,861, filed Jul. 29, 2015.
Search Report in European Patent Application No. EP 16 17 9920, dated Dec. 8, 2016.
Ladani, L-J., et al., "Microstructure and mechanical strength of snag-based solid liquid inter-diffusion bonds for 3 dimensional integrated circuits", Thin Solid Films, Elsevier, Amsterdam, NL, vol. 518, No. 17, Mar. 19, 2010, pp. 1948-4954.
Search Report in European Patent Application No. EP16179960, dated Mar. 7, 2017, 19 pages.
ONS01778 Action on the Merits by U.S.P.T.O regarding U.S. Appl. No. 14/812,861, filed Jul. 29, 2015.

\* cited by examiner

DIE BONDING TO A BOARD

CROSS-REFERENCE TO RELATED APPLICATIONS

This application claims priority to U.S. Provisional Application No. 62/194,204, filed on Jul. 18, 2015, entitled "DIE BONDING TO A BOARD," assigned invented by Michael J. Seddon et al.

Related subject matter is found in a copending patent application entitled "FLIP CHIP BONDING ALLOYS", U.S. patent application Ser. No. 14/812,816, filed Jul. 29, 2015, by Michael J. Seddon et al. and assigned to the assignee hereof.

FIELD OF THE DISCLOSURE

The present disclosure relates generally to circuit manufacturing, and more particularly to device bonding techniques.

BACKGROUND

Multichip modules are increasingly being used to control operations of machines and systems. For a variety of manufacturing considerations, however, the various devices are not always installed into the multichip modules at the same time. Wire bond applications are often used though not always appropriate for certain applications. For example, a wire bond solution may not be appropriate in situations where footprint requirements necessitate efficient integrated circuit (IC) real estate usage.

An alternative approach is to use solder alloys and pastes. Using solder in either form is beneficial for bonding one die to a board, such as a ceramic or substrate board or metal lead frame, in certain circumstances. Typically, the solder alloy or paste will flow when the device and board are placed in a reflow oven or furnace and will then cool to bond the die to the board and, if desired, to create an electrical connection between the device and board. For the case of a single die, this approach is beneficial in that the die may be removed and replaced if faulty with a subsequent reflow in a reflow oven or furnace.

One issue with using a solder alloy or paste, however, is that the solder will reflow and the bond between the original die and the board will fail when the board and a new die are subsequently placed in the reflow oven to bond the new die to the board. When the bond fails, the original die may even slide off of the board or metal lead frame. One approach to solve this problem has been to use different metal alloys for the original or first die so that the metal alloys bonding the die have a higher melting temperature than what is needed for re-flowing the solder alloys of the second or new die. Two metals that have been used with this approach include lead and gold. Lead, however, is known to cause health issues and is not always desirable. Gold, on the other hand, is expensive and drives up product cost. Accordingly, solder is often used despite its limitations.

BRIEF DESCRIPTION OF THE DRAWINGS

The present disclosure may be better understood, and its numerous features and advantages made apparent to those skilled in the art by referencing the accompanying drawings according to various embodiments in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

Figure 1:
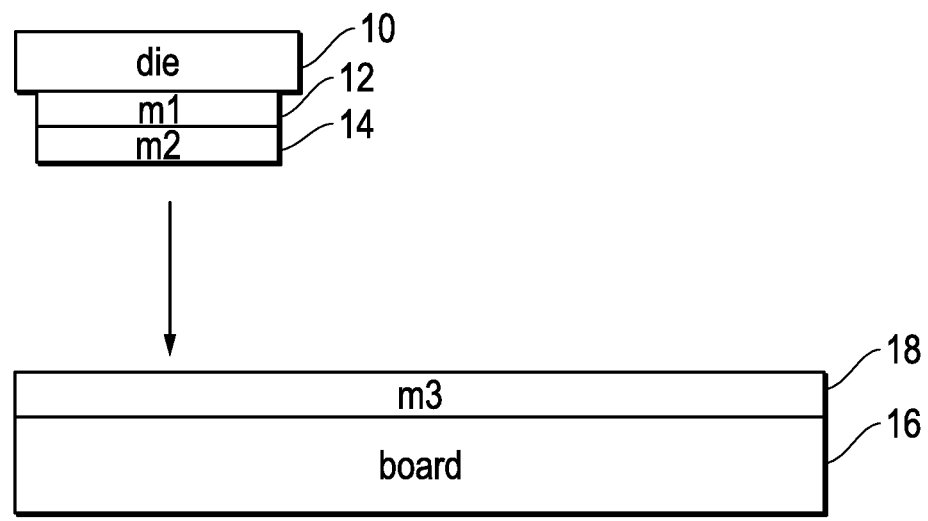
FIG. 1 is a side view of a circuit board and a first die prior to bonding the first die to the circuit board.

FIG. 1 is a side view of a circuit board and a first die prior to bonding the first die to the circuit board according to an embodiment. FIG. 1 illustrates a system that includes a die 10 having metal layers 12 and 14 and a board 16 with metal layer 18. Board 16 may be constructed in any known manner and may comprise, for example, a ceramic or organic substrate board. Alternatively, a metal lead frame may be used in place of a board. Hereinafter, whenever any reference to a board, a ceramic board, a substrate board or a metal lead frame is used, it should be understood that any one of the other supporting structural elements (board, substrate board, ceramic board or metal lead frame) could be used alternatively.

Metal layer 18 of board 16 comprises at least one of a solderable metal layer such tin, silver or copper. Metal layer 18 may also comprise a plurality of metal or metal alloy layers, for example, copper, nickel, tin or silver or an alloy formed of two or more metals. The metal layers on the die comprise a combination of silver, tin and nickel in one embodiment. The die may include three or more layers. While FIG. 1 shows two layers 12 and 14 on die 10 and one layer 18 on board 16, the embodiments are not limited and the die and board may include additional layers. Moreover, any one layer may be an alloy and is not required to be a single element or metal. For example, layer 14 also labeled as m2 may be an alloy in one embodiment.

As is suggested in FIG. 1, die 10 is to be attached to board 16 (more specifically, to layer 18 of board 16). In the prior art, a solder paste or die attach is often used to bond the die to the board. Here, however, the metals or metal alloys of the plurality of metal layers on the die and at least one layer on the board are selected so that they melt and form an alloy during reflow having a subsequent melting temperature that is higher than the temperature used during reflow of the original metal layers to create the alloy. In the described embodiment, metals are chosen so that, even if a solder or solder paste is used, the metals will melt and mix with the solder to create an alloy with a melting temperature that is higher than what is required to reflow solder. To "reflow" a board and one or more die, the board is often placed within a reflow furnace or oven at a specified temperature profile over a specified period. Other technologies for reflowing the metals may also be used in alternative processes. Any reference herein to a furnace or oven should be understood to include alternative technologies for melting or reflowing the metal layers of the die and board.

Figure 2:
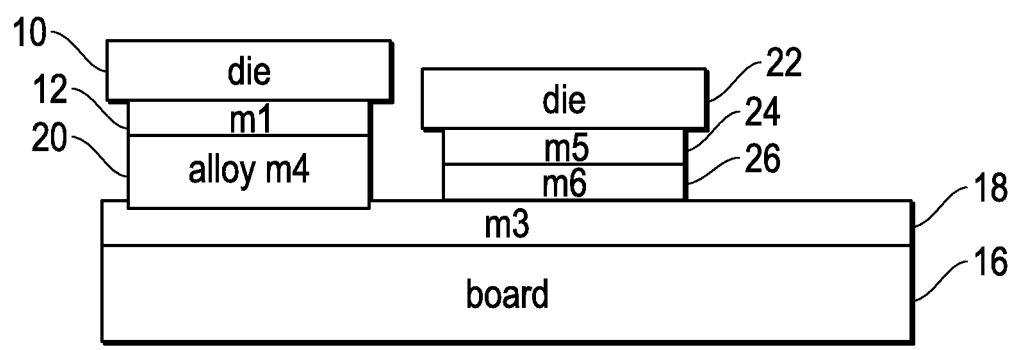
FIG. 2 is a side view of a circuit board and a bonded first die and an unbonded second die.

FIG. 2 is a side view of a circuit board and a bonded first die and an unbonded second die according to an embodiment. More specifically, die 10 and board 16 are shown after a reflow wherein metals of at least one of layers 12 and 14 of die 10 melted and mixed with layer 18 of board 16 to create alloy layer 20 to bond die 10 to board 16. Alloy layer 20, being formed by the specific combination of metals m2 and m3 (and potentially m1) has a higher melting (reflow) temperature than any one of metals m1, m2 and m3 of layers 12, 14 and 18, respectively. In the example of FIG. 2, all of metal m2 has mixed with metal m3 to create alloy m4 of layer 20.

Here, in FIG. 2, die 22 having layers 24 and 26 is shown disposed against layer 18 of board 16 but is not yet attached or bonded to board 16. Accordingly, the board and die 10 and die 22 are reflowed in the reflow oven or furnace to cause metals m3 and m6 (and potentially m5) to melt and reflow to create the bond between die 22 and layer 18 of board 16. If the same reflow temperature is used as before, metals m6 and m3 (and possibly m5 of layer 24) will melt to create a new alloy without completely melting alloy m4 of layer 20. Depending on operation, alloy m4 may partially or slightly melt, but will not melt so completely that the bond between the die and the board is compromised to the point that the die may be removed or may even accidentally slide off of the board.

Figure 3:
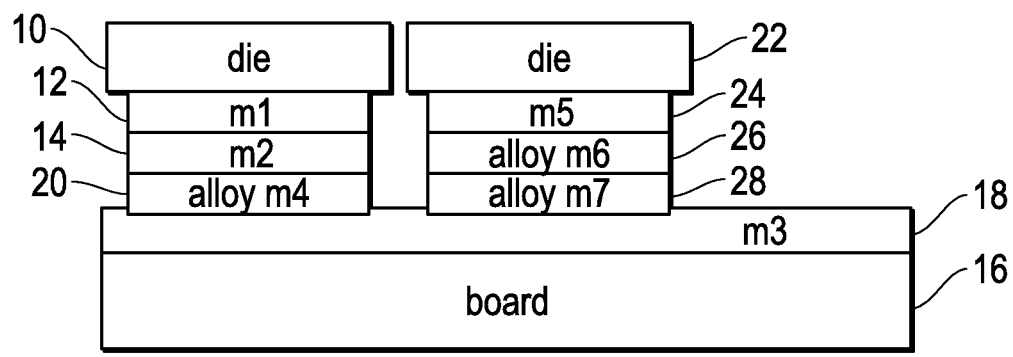
FIG. 3 is a side view of a circuit board and a bonded first die and second die.

FIG. 3 is a side view of a circuit board and a bonded first die and second die according to an embodiment. In the example of FIG. 3, some metal m2 of layer 14 remains while some has mixed with metal m3 of layer 18 to create alloy m4 of layer 20. This is in contrast to FIG. 2 where all of metal m2 of layer 14 melted and mixed with metal m3 of board layer 18. As before, alloy m4 was created during a first reflow. Additionally, some of metal m6 of layer 26 remains while some of metal m6 has mixed with metal m3 of layer 18 to create alloy m7 of layer 28. Alloy m7 was created during a second reflow at the first reflow temperature without completely reflowing (melting) metal m4 of layer 20 during the second reflow to bond or attach die 22 to board 16. If board 16 was to be reflowed a third time to add another die, either alloy m4 or m7 will not completely melt as long as the reflow temperature is the same as before or at least lower than the melting temperature of metals m4 and m7 of layers 20 and 28, respectively.

Figure 4:
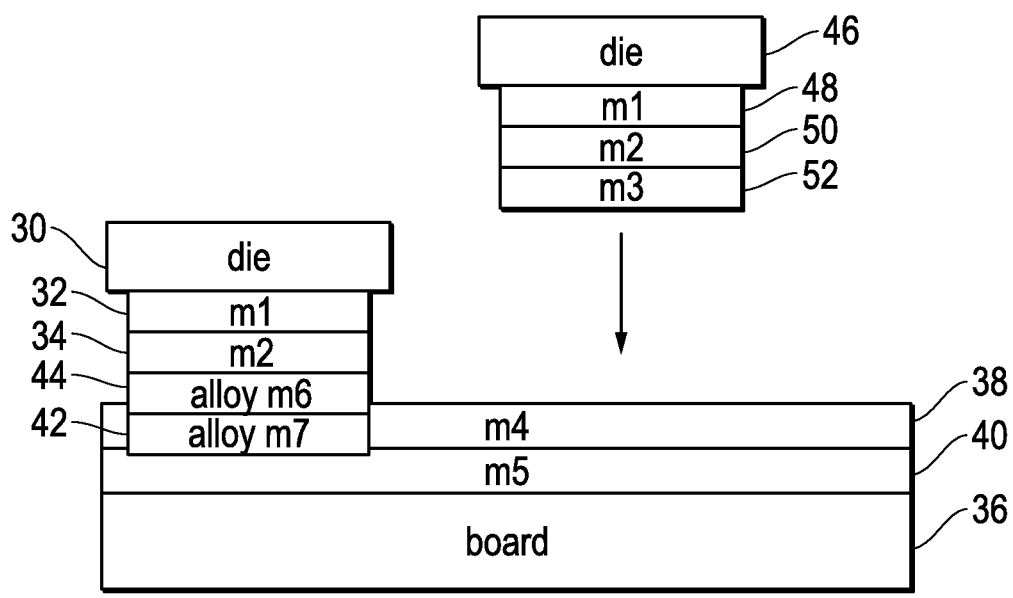
FIG. 4 is a side view of a circuit board and a bonded first die and a second die.

FIG. 4 is a side view of a circuit board and a bonded first die and a second die according to an embodiment. Referring to FIG. 4, a die 30 is shown bonded to board 36 after a reflow. Prior to the reflow, die 30 included at least three metal layers similar to die 46 that includes layers 48, 50 and 52. In the illustrated embodiment of FIG. 4, die 30 includes original layers 32 and 34 and new alloy layers 42 and 44. Board 36 includes layers 38 and 40 that may each be a pure metal or an alloy. During the reflow, the original layer of die 30 included metal m3 (and potentially a portion of layer 34 comprising m2) that mixed with at least one of metals m4 and m5 of layers 38 and 40 of board 36 to create layers 42 and 44 that comprise at least one alloy.

In one embodiment of the invention, a process includes reflowing a die until at least two metals melt and mix to create an alloy. As an additional process step, the reflow may be extended in time to a second period to cause at least a third metal, if not a fourth metal, of either a die layer or a board layer to mix to create additional alloys. FIG. 4 illustrates the results of this additional process step wherein two metal alloys shown as layers 42 and 44 were created through re-flowing an extended or additional time to partially or wholly combine metals m2, m3, m4 and m5. Furthermore, the process may optionally include extending the reflow time to create additional alloys from the various metal layers of the die and board that comprise metals m1-m5. As before, when die 46 displaced onto board 36 and re-flowed, alloys m6 and m7 of die layers 42 and 44 will not completely melt and reflow. Accordingly, board 36 will maintain a bond with die 30.

It should be understood that distinct layers are shown here to represent alloys with differing combinations of metal. In actual practice, however, the ratios of metal may gradually change depending on original metal layer thicknesses and a total period of the reflow process to create the alloys. Accordingly, it should be understood that the term "intermetallic alloy" or "intermetallics" may be used in place of alloy more appropriately depending on the results of the reflow process. Reflow duration and relative layer thickness and construction affect how much the various metal layers melt and how well they mix to create a uniform distribution of metals within the resulting alloy. For example, if the metal compositions are different in different areas, the term "intermetallic alloy" may be more appropriate than the term "alloy" because "alloy" tends to refer to a homogenous or uniform distribution of metal content. References herein to alloy are intended to include intermetallic alloys.

Figure 5:
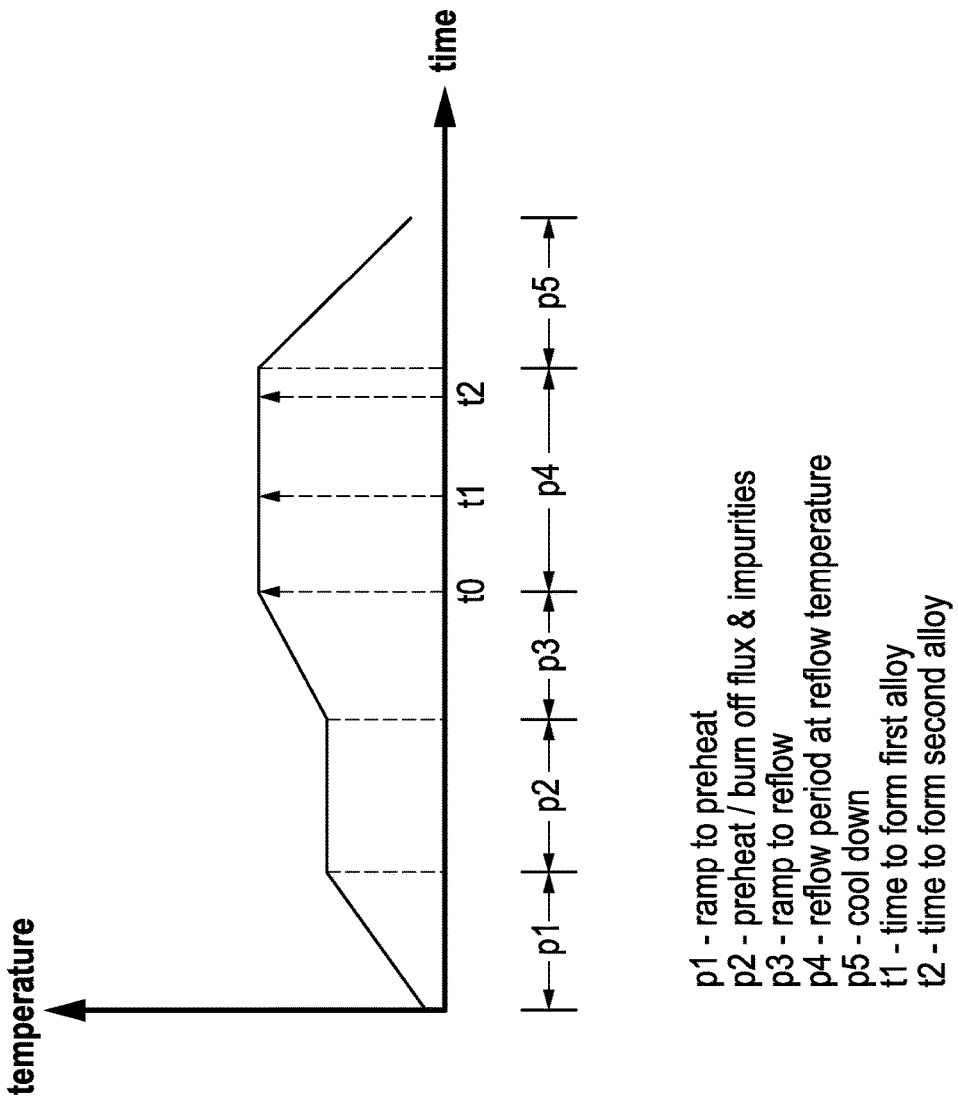
FIG. 5 is a temperature-time graph that illustrates a reflow thermal profile for a first die.

FIG. 5 is a temperature-time graph that illustrates a reflow thermal profile for a first die according to one embodiment. Referring now to FIG. 5, a reflow thermal profile graph is shown that identifies five time periods p1-p5 that represent the various thermal stages used in a process according to one embodiment. As may be seen, period p1 represents a heating ramp to preheat the reflow oven or furnace to a preheat temperature. Period p2 represents the preheat period that is used in a typical reflow process. Period p2 may be used to burn off impurities or flux and/or to gradually increase temperature to avoid damaging the board or die. Period p3 represents a heating ramp to a reflow temperature. Period p4 represents the duration that a reflow temperature is maintained. Typically, in prior art applications, a reflow temperature is not maintained for any notable duration given the traditional solder elements that are used to bond leads and devices to each other or to a printed circuit board. Here, however the reflow temperature is maintained at least until a time t1 is reached.

Time t0 is the time at which the reflow temperature is reached while time t1 is an amount of time that is required to form an alloy and create a bond. Time t1 may coincident with time t0. Time t1 is a function of what metals are being melted and the relative thickness of the metal layers. Furthermore, as described in relation to previous figures, a plurality of metal layers may be used on at least one of the die or the board. If the reflow temperature is maintained beyond time t1 to time t2, additional alloys may be formed from the additional metal layers disposed either on the die or on the board because maintaining the reflow temperature causes additional melting. Accordingly, shortly after time t2, period 5 begins representing a cool down period. As described before, the alloys that are formed by the reflow temperature at times t1 and t2 have subsequent melting temperatures that are higher than the reflow temperature of period p4. The process represented by FIG. 5 is a reflow process for a first die.

Figure 6:
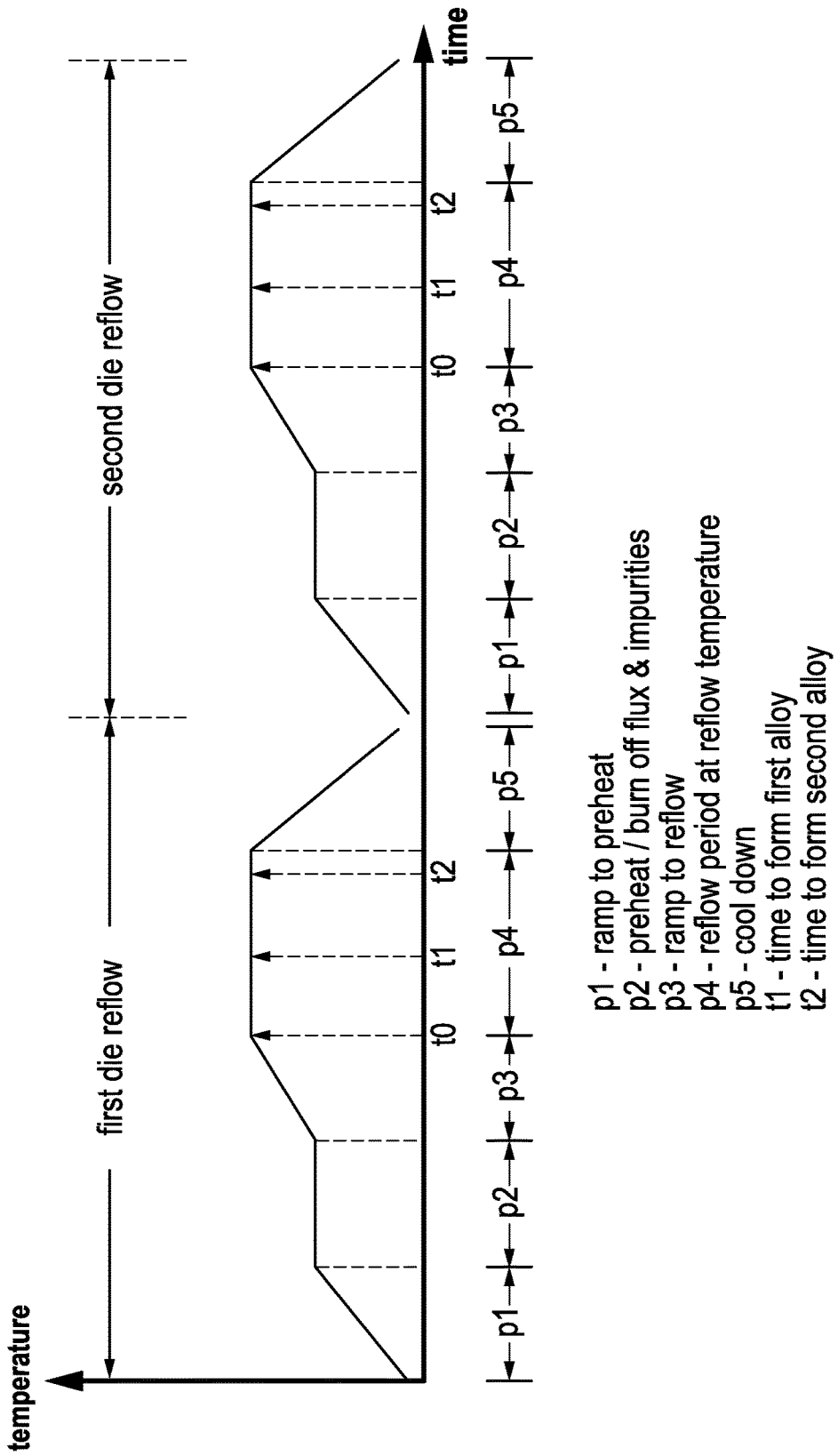
FIG. 6 is a temperature-time graph that illustrates a reflow thermal profile for a first die and a second reflow for a second die.

FIG. 6 is a temperature-time graph that illustrates a reflow thermal profile for a first die and a second reflow for a second die according to one embodiment. Essentially, the reflow thermal profile illustrated in FIG. 6 is the equivalent of that in FIG. 5 except that the profile is repeated. The left-hand portion of the reflow thermal profile of FIG. 6 represents the reflow process for a first die while the right-hand portion represents the reflow process for a second die to which the first die is subjected. The descriptions for the various periods made in relation to FIG. 5 are the same here and won't be repeated. The reflow process for the second die is performed with the first die being already bonded to the board. Because of the characteristics and higher melting temperatures for the alloys that are formed during the first reflow, however, the first die and its metal layers do not reflow (completely or fully melt to the point that the bond between the board and die is compromised) while the metal layers for the second die are re-flowing in the reflow oven or furnace during the second reflow cycle illustrated in FIG. 6.

Figure 7:
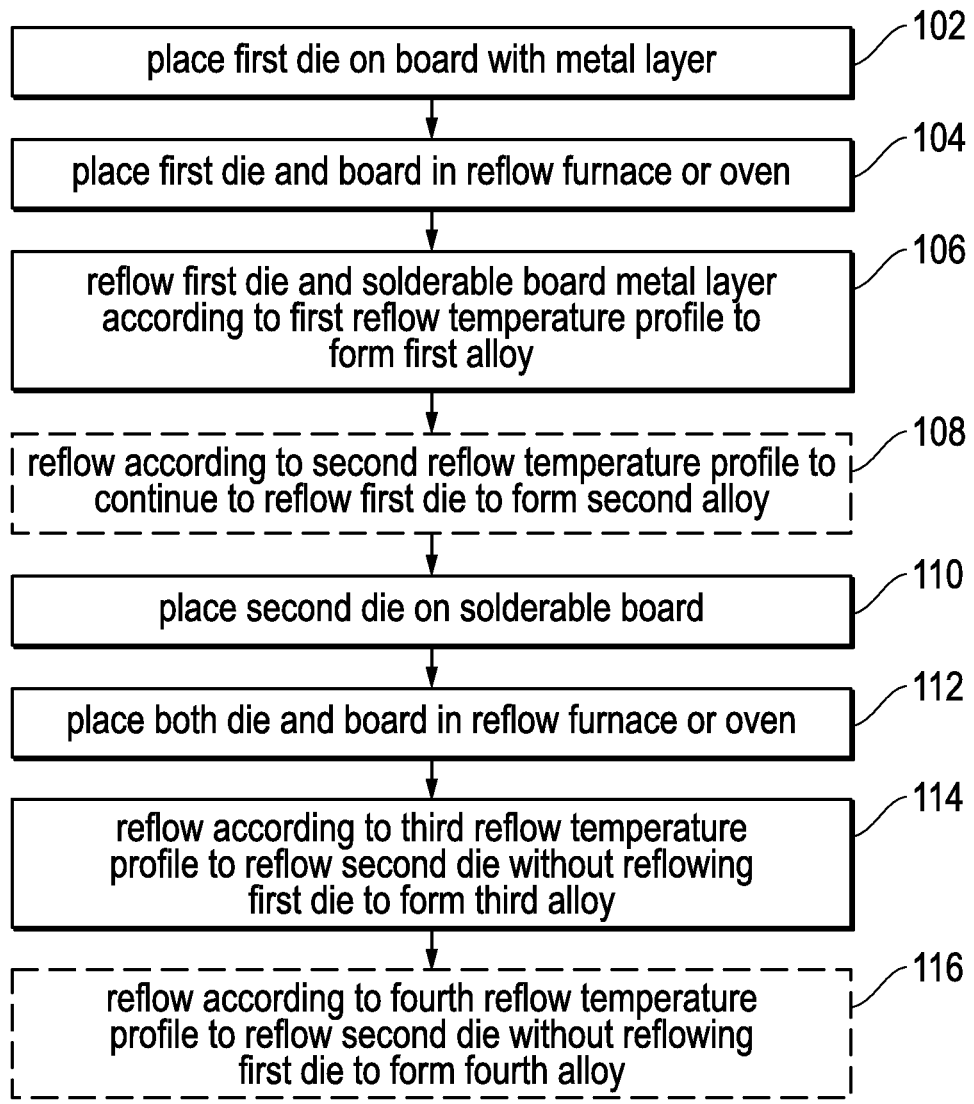
FIG. 7 is a flow chart illustrating a method for bonding a die.

FIG. 7 is a flowchart illustrating a method for bonding a die according to one embodiment. The method of FIG. 7 commences with placing a first die on a solderable board with metal layer (102). The solderable board may comprise any type of known board including ceramic boards and substrate boards or metal lead frames that are used for securing or connecting electronic devices. In one embodiment, the metal layer is a solderable metal layer such as copper. The die, in the disclosed embodiment, includes two metal layers formed on one surface while the board includes at least one solderable metal surface. The die is placed on the board so that the outer metal layers of board and first die are in contact with each other. Thereafter, the first die and the board are placed in a reflow furnace or oven (104). The board and die kept in the heated reflow oven to reflow the first die and the solderable board metal layer according to a first reflow temperature profile to form a first alloy (106).

The temperature profile may include a temperature ramp to a specified temperature with an immediate cool down following or a ramp to a temperature or temperature range that is maintained for a specified period or duration sufficient to allow the metal layers to reflow to create at least one alloy. Reference herein to temperature profiles include any combination of temperature and time that is used to melt the die and board metal layers to create the desired alloys and/or intermetallic alloys. The method optionally includes continuing the reflow according to a second temperature profile (e.g. at the first reflow temperature profile for a second period) to continue to reflow the first die and one or more of the metal layers of the die and the board to form a second alloy or intermetallic alloy (108).

After a first reflow process is concluded and any formed alloys have cooled and hardened, the method includes placing a second die on the solderable board (110) board with the first and second die in the reflow furnace or oven (112) to essentially repeat the reflow process. Thereafter, second die and board metal layers are reflowed according to a third reflow temperature profile without completely re-flowing any alloy metals of the first die and board that were created during the first reflow process. The second die and board metal layers are re-flowed to form a third alloy for the second die and board (114). Finally, the method optionally includes continuing to reflow the metal layers of the second die and board according to a fourth temperature profile to form a fourth alloy for the second die (116). It should be understood that the first, second, third and fourth temperature profiles may be similar or may be varied in thickness or composition. Similarly, the first, second, third and fourth alloys and/or intermetallics that are created are based on the temperature profiles and metal layer compositions and may therefore be similar or different.

Figure 8:
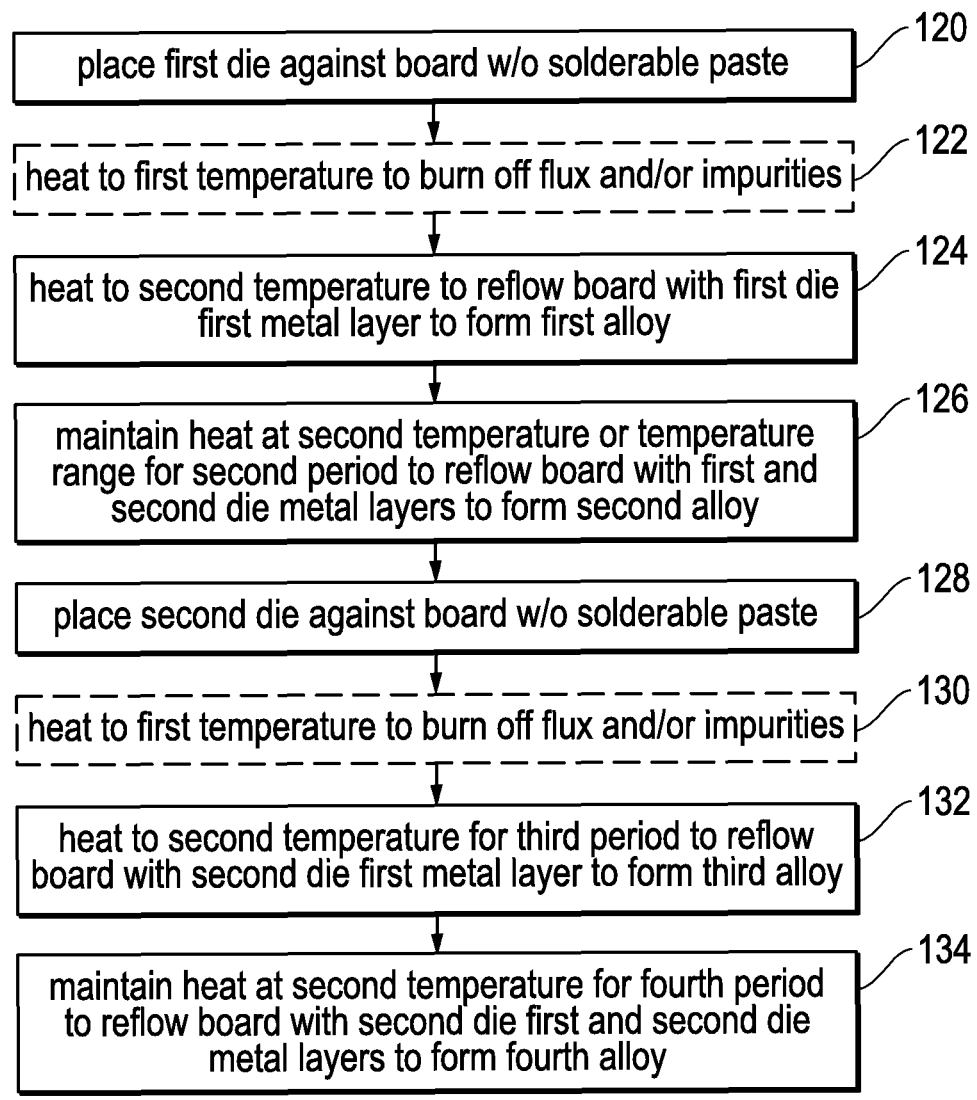
FIG. 8 is a flow chart illustrating a method for bonding a die.

FIG. 8 is a flowchart illustrating a method for bonding a die according to one embodiment. Initially, a first die is placed against a board without a solderable paste. As described before, the die has at least two metal layers and the board has at least one metal layer that is solderable in one embodiment (120). Thereafter, the die and the board are heated to a first temperature to burn off flux and/or impurities (122). In some processes, a flux is added to external metal layers to avoid unwanted oxidation that may interfere with reflow processes. In one embodiment, the die and board are placed into a reflow oven or furnace to eventually reflow the metal layers to create an alloy or inter-metallic layer (a layer differing metal compositions throughout the metal). Thereafter, the board and die are heated to a second temperature to reflow the board metal layer with at least one metal layer of the die to form a first alloy (124). In one embodiment, the ambient temperature is reduced from the second temperature as soon as the second temperature is reached. For some metal combinations, once the ambient temperature reaches a specified reflow temperature, the metals are sufficiently melted and a cool down process may begin immediately unless other metal layers are also to be melted to form the desired alloy.

Optionally, the board and die are kept at the second temperature for a specified period. The method continues with continuing to maintain heat to continue to reflow the board metal with first and second die metal layers to form a second alloy (126). This step includes maintaining a specified temperature range (e.g., the second temperature reached in step 124) for a specified period. In the described embodiment, a solder or solder paste was not used. Alternatively, for the method of FIG. 8, a solder or solder paste may be used in addition to the metal layers of the board and die when the die is placed against the board so long as a metal melts and mixes with the solder or solder paste to create an alloy with a higher melting temperature than the melting temperature of the solder.

After the first and second alloys have cooled enough to bond the die to the board, the method includes placing a second die against the board without solderable paste (128). Thereafter, the method optionally includes heating the second die and the board with the attached first die to the first temperature to burn off flux and/or impurities (130). Thereafter, the reflow oven or furnace temperature is increased to heat the board according to a fourth temperature to reflow the board metal layer and the second die first metal layer to form a third alloy (132). As described in relation to step 124, the fourth temperature may be the same as the second temperature or it may be modified according to design requirements. Finally the method concludes with maintaining the heat at the fourth temperature or within a temperature range approximately equal to the fourth temperature to reflow the board metal layer with the second die first and second die metal layers to form a fourth alloy (134). As before, this step may comprise merely maintaining a specified temperature or temperature range for a specified period. It should be understood that the first and second die might have substantially similar metal layers thereby resulting in substantially similar alloys from the reflow processes. In other words, the third and fourth alloys may be very similar to the first and second alloys, respectively if the metals and temperature profiles or processes are similar.

The above-disclosed subject matter is to be considered illustrative, and not restrictive, and the appended claims are intended to cover all such modifications, enhancements, and other embodiments that fall within the true scope of the claims Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of bonding a plurality of die having a plurality of metal layers on a die surface to a board or metal lead frame, comprising:

placing a first die onto a solderable surface of the board or the metal lead frame, the first die comprising at least three metal layers, the board comprising one of a ceramic board or substrate board, or a metal lead frame wherein a top metal die layer is disposed against the solderable surface of the first die;

first reflowing at least one of first and second metal die layers of the first die at a first reflow temperature in a range of 220 degrees C. to 260 degrees C. for a first period to form a first alloy to create a bond between the first die and the board or metal lead frame; and maintaining heat at the first reflow temperature for a second period to reflow the board or metal lead frame and the first and second metal die layers to form a second alloy placing a second die onto the solderable surface of the board or the metal lead frame, the second die comprising at least three metal layers, wherein a top metal die layer is disposed against the solderable surface of the second die;

second reflowing at least one of first and second metal die layers of the second die at the first reflow temperature in the range of 220 degrees C. to 260 degrees C. for the first period to form the first alloy to create a bond between the second die and the board or metal lead frame; and maintaining heat at the first reflow temperature for the second period to reflow the board or metal lead frame and the first and second metal die layers of the second die to form the second alloy, wherein the first and second alloys have melting temperature temperatures that are higher than 260 degrees C.

2. The method of claim 1 wherein the solderable surface comprises copper and the first and second metal die layers of each of the first die and the second die comprise silver and tin, respectively.

3. The method of claim 1 wherein at least one layer of each of the first die and the second die comprises nickel and at least one layer comprises silver.

4. The method of claim 1 wherein the second period is long enough to cause the solderable surface and both the second metal layer and a third metal layer of each of the first die and the second die on the die to form a third alloy.

5. The method of claim 1 wherein each of the first reflowing and the second reflowing is for a period that causes an alloy to form comprising nickel, silver and tin.

6. The method of claim 1 wherein the board comprises a ceramic board with copper and silver layers and wherein each of the first die and the second die comprises nickel, silver and tin layers.

7. The method of claim 1 wherein the first alloy melting temperature of each of the first die and the second die is at least 10 degrees C. higher than the first reflow temperature.

8. A method of bonding a die to a board, comprising:

placing a first die having a first solderable surface against a board without using a solder paste, the board having a second solderable surface, the board further comprising one of a ceramic or substrate board;

wherein the first solderable surface of the first die comprises a first plurality of metal layers comprising at least three metal layers and wherein an outer layer of the first solderable surface comprises a silver and tin alloy having a silver composition that is less than 7 percent by weight and further wherein an inner layer next to the outer layer is either a metal layer or metal alloy layer that comprises one of titanium, nickel or silver;

reflowing the first die at a first reflow temperature to form a first additional alloy having a first melting temperature that is higher than the first reflow temperature wherein the first additional alloy bonds the first die to the board;

maintaining heat at the first reflow temperature for a second period to reflow the board and the outer and inner layers to form a second additional alloy having a second melting temperature that is higher than the first reflow temperature;

subsequently placing a second die having a second solderable die surface onto the second solderable surface of the board and reflowing at the first reflow temperature without reflowing the first additional alloy of the first die to create a second additional alloy having a melting temperature that is higher than the first reflow temperature; and subsequently reflowing the second die for a second period to create a fourth additional alloy.

9. The method of claim 8 wherein the second solderable surface of the board comprises at least one of copper, silver and tin layers.

* * * * *